(12) United States Patent
Oda

(10) Patent No.: US 9,305,617 B2
(45) Date of Patent: Apr. 5, 2016

(54) DATA AND STROBE DECOMPRESSING MEMORY CONTROLLER AND MEMORY CONTROL METHOD

(75) Inventor: Minoru Oda, Yamanashi (JP)

(73) Assignee: NEC Platforms, Ltd., Kanagawa (JP)

( * ) Notice: Subject to any disclaimer, the term of this patent is extended or adjusted under 35 U.S.C. 154(b) by 65 days.

(21) Appl. No.: 14/342,263

(22) PCT Filed: May 28, 2012

(86) PCT No.: PCT/JP2012/003478
§ 371 (c)(1),
(2), (4) Date: Feb. 28, 2014

(87) PCT Pub. No.: WO2013/035223
PCT Pub. Date: Mar. 14, 2013

(65) Prior Publication Data
US 2014/0229668 A1    Aug. 14, 2014

(30) Foreign Application Priority Data
Sep. 6, 2011  (JP) .................................. 2011-194242

(51) Int. Cl.
*G06F 12/00*   (2006.01)
*G11C 7/10*    (2006.01)
*G06F 13/16*   (2006.01)

(52) U.S. Cl.
CPC .......... *G11C 7/1072* (2013.01); *G06F 13/1689* (2013.01)

(58) Field of Classification Search
CPC .............................. G06F 12/0879; G06F 13/32
See application file for complete search history.

(56) References Cited

U.S. PATENT DOCUMENTS

2009/0091987 A1   4/2009  Butt et al.
2009/0129179 A1   5/2009  Yamazaki
(Continued)

FOREIGN PATENT DOCUMENTS

EP    2 065 894 A1    6/2009
JP    2000-206212 A   7/2000
(Continued)

OTHER PUBLICATIONS

Elpida Memory, Inc. "Users Manual, New Features of DDR3 SDRAM", Document No. E1503E10 (Ver.1.0), Mar. 1, 2009 (K) Japan, http://www.elpida.com, pp. 1-18.
(Continued)

*Primary Examiner* — Gurtej Bansal
(74) *Attorney, Agent, or Firm* — Wilmer Cutler Pickering Hale and Dorr LLP

(57) ABSTRACT

Write-leveling, a write-leveling control unit (250) adjusts the delay amounts of DQS control unit (242) and a DQ control unit (244), at first, within a range of less than one clock cycle. Then, with respect to each SDRAM (282), a read-data row acquired by performing a read after a write of an expected value data row is compared value data row, and depending upon the comparison result, the delay amounts of the DQS control unit (242) and the DQ control unit (244) are adjusted in clock-cycle units. At the above write-time, control is performed so that the DQS control unit (242) outputs a data strobe signal (DQS) which is 2×M clock cycles longer than a burst length defined according to a specification, and the DQ control unit (244) adds M units each of data before and after a number of units of expected value data rows that match the burst length in order to output the data.

4 Claims, 11 Drawing Sheets

(56) References Cited

U.S. PATENT DOCUMENTS

2009/0161453 A1 6/2009 Giovannini et al.
2010/0246290 A1 9/2010 Maclaren et al.
2011/0216611 A1 9/2011 Giovannini et al.

FOREIGN PATENT DOCUMENTS

| | | |
|---|---|---|
| JP | 2001-217694 A | 8/2001 |
| JP | 2009-075682 A | 4/2009 |
| JP | 2009-130455 A | 6/2009 |
| JP | 2009-284266 A | 12/2009 |
| WO | WO-2011/077573 A1 | 6/2011 |
| WO | WO-2011/077574 A1 | 6/2011 |

OTHER PUBLICATIONS

Extended European Search Report corresponding to European Application No. 12830031.6, dated Apr. 1, 2015, 8 pages.
International Search Report corresponding to PCT/JP2012/003478 dated Jul. 31, 2012 (3 pages).

DATA AND STROBE DECOMPRESSING MEMORY CONTROLLER AND MEMORY CONTROL METHOD

CROSS-REFERENCE TO RELATED APPLICATIONS

This application is a national stage application of International Application No. PCT/JP2012/003478 entitled "Memory Controller and Memory Control Method," filed on May 28, 2012, which claims the benefit of the priority of Japanese patent application No. 2011-194242, filed on Sep. 6, 2011, the disclosures of each of which are hereby incorporated by reference in their entirety.

TECHNICAL FIELD

The present invention relates to memory control, and in particular, to write leveling performed on a DDR3 memory interface.

BACKGROUND ART

A delay time of a signal is adjusted in various semiconductor apparatuses (Patent Literatures 1 to 3). In the DDR 3 memory interface (DDR: Double Data Rate) that is standardized by JEDEC (Joint Electron Device Engineering Council) as a standard of DRAM (Dynamic Random Access Memory), a fly-by topology is employed in a connection between a memory controller and DIMM (Dual Inline Memory Module). Therefore, so-called write leveling is defined for adjusting a delay time of a data strobe signal DQS that is output from the memory controller to each of a plurality of memory elements included in the DIMM (Patent Literature 4).

FIG. 11 is identical to FIG. 19 of Patent Literature 4 and schematically shows an example of a connection between the memory controller 90 and the DIMM 91 that are compliant with the DDR3 memory interface. As shown in the drawing, among the signal lines connecting between the memory controller 90 and the DIMM 91, the signal line for a clock signal CK, an address signal Add, and a command signal CMD is connected between the memory controller 90 and n (n: a natural number of two or greater) memory elements (SDRAM: Synchronous Dynamic Random Access Memory) 92-1 to 92-n in the DIMM 91 by daisy chain wiring. Further, the signal lines for the data signal DQ and the data strobe signal DQS are connected between the memory controller 90 and the respective SDRAMs 92-1 to 92-n in the DIMM 91.

In the following explanation, as for codes to represent the SDRAMs, when it is necessary to identify a specific one of the plurality of SDRAMs, codes 92-1 to 92-n shall be used, while when any given SDRAM is specified, a code 92 shall be used.

Further, as for codes to represent data signals, when it is necessary to identify a specific one of the plurality of data signals, codes DQ-1 to DQ-n shall be used, while when any given data signal is specified, a code DQ shall be used.

Similarly, as for codes to represent data strobe signals, when it is necessary to identify a specific one of the plurality of data strobe signals, codes DQS-1 to DQS-n shall be used, while when any given data strobe signal is specified, a code DQS shall be used.

Due to a propagation delay caused by the daisy chain wiring of the signal line for a clock signal CK, clock signals CK that are output from the memory controller 90 are unable to simultaneously arrive at all of the SDRAMs 92-1 to 92-n. For example in the JEDEC standard, as for the external dimensions of the DIMM 91, the length L1 is defined as 133 mm. Therefore, between the SDRAM 92-1 disposed at one end of the DIMM 91 in the length direction and the SDRAM 92-n disposed at the other end of the DIMM 91 in the length direction, there is a difference in arrival times of about 1 ns (7 ps/mm*133 mm=931 ps).

Accordingly, the JEDEC standard defines the write leveling to be used in the DDR3 memory interface. Referring to FIG. 12 (FIG. 20 of Patent Literature 4), a brief explanation of the write leveling shall be given.

The term "write leveling" refers to the function of sampling the clock signal CK by using the data strobe signal DQS output from the memory controller 90, detecting the phase relationship between the data strobe signal DQS and the clock signal CK, and adjusting a delay time of the data strobe signal DQS. The write leveling function is implemented, as shown in FIG. 12, by incorporating variable delay circuits 93-1 to 93-n, which can change respective delay times of the data strobe signals DQS-1 to DQS-n, in the memory controller 90 corresponding to the plurality of SDRAMs 92-1 to 92-n, respectively Hereinafter, as for codes to represent delay circuits, when it is necessary to identify a specific one of the plurality of delay circuits, codes 93-1 to 93-n shall be used, while when any given delay circuit is specified, a code 93 shall be used.

Specifically, a CPU (Central Processing Unit) not shown in the drawings sets delay times t1-1 to t1-n for the data strobe signals DQS-1 to DQS-n that are output to the respective SDRAMs 92 based on the data signals DQ-1 to DQ-n that are output from the SDRAMs 92-1 to 92-n, respectively. In this manner, the data strobe signals DQS-1 to DQS-n are adjusted such that they are input to the SDRAMs 92-1 to 92-n, respectively, almost at the same time as the clock signals CK.

That is, for example, at the point when the write leveling is completed, the delay circuits 93-1 to 93-n delay the data strobe signals DQS by only the delay times t1-1 to t1-n, respectively, and the data strobe signals DQS and the clock signals CK are input to the SDRAMs 92-1 to 92-n with their phases aligned.

Note that the write leveling is performed at the time of initializing a memory device that includes the DDR3 memory interface. That is, when the initialization including the write leveling is completed, the delay times t1-1 to t1-n are determined, and the clock signals CK and the data strobe signals DQS are input to the respective SDRAMs with their phases aligned.

CITATION LIST

Patent Literature

Patent Literature 1: Japanese Unexamined Patent Application Publication No. 2000-206212
Patent Literature 2: Japanese Unexamined Patent Application Publication No. 2001-217694
Patent Literature 3: Japanese Unexamined Patent Application Publication No. 2009-284266
Patent Literature 4: Japanese Unexamined Patent Application Publication No. 2009-075682

SUMMARY OF INVENTION

Technical Problem

When a delay in the data strobe signal DQS is adjusted, the delay times (which are the above-mentioned delay times t1-1 to t1-n) of DQS are controlled by a DLL (Delay Locked Loop) circuit under normal circumstances. In such a case, there is a problem that when a necessary delay time increases, an adjustment width increases, thereby increasing an error in the adjustment. Accordingly, there has been a restriction on signal line wiring in design of printed boards so that the adjustment width of the delay time of the data strobe signal DQS will be less than or equal to one clock cycle.

Incidentally, due to an increase in the speed of memory elements recently, implementation under the above-mentioned restriction is becoming difficult. Thus, in reality, there are a number of memory devices that require the adjustment width of more than or equal to one clock cycle. When a delay time more than or equal to one clock cycle is necessary, an initialization time explained below could become longer.

Detecting the phase relationship between the clock signal CK and the data strobe signal DQS at the time of the write leveling is performed based on a result of comparison between a read data sequence and an expected value data sequence, which are obtained by synchronizing with the data strobe signal DQS having a burst length defined in the standard, writing the expected value data sequence composed of known data, in which the number of the pieces of the known data matches the burst length, and reading the read data sequence, for each of the memory elements.

Incidentally, there is a possibility that when the writing is performed in a state where the clock signal CK and the data strobe signal DQS largely differ in their phases, a first one or more pieces of data or a last one or more pieces of data in the expected value data sequence may not be written. Since the above-mentioned situation is not defined in the JEDEC specifications, the state inside the SDRAMs is not guaranteed and there is no other method than performing a reset operation in order to return the SDRAM to a fixed state. Accordingly, there is a problem that the initialization time will become long.

The present invention is made in light of the above circumstances and provides a technique for preventing the initialization time from becoming long at the time of the write leveling.

Solution to Problem

An exemplary aspect of the present invention is a memory control method. The method performs write leveling by the following procedure.

Firstly, for a DQS control unit that is provided for each of memory elements included in a memory module that is compliant with a DDR3 memory interface and outputs a data strobe signal DQS to the memory element and for a DQ control unit that is provided for each of the memory elements and synchronizes with the data strobe signal DQS that is output to the memory device, outputs write data, and receives read data, adjustment is performed on a delay amount of an output timing of the data strobe signal DQS and a delay amount of an output timing of the write data and a reception timing of the read data within a range of less than one clock cycle.

Next, a read data sequence, which is obtained by writing an expected data sequence and reading the read data sequence, is compared with the expected value data sequence for each of the memory elements, and according to a result of the comparison, adjustment is performed on the delay amount of the output timing of the write data and the reception timing of the read data by a unit of clock cycle in each of the DQS delay control unit and the DQ delay unit.

Note that, at the time of the writing, control is performed on the DQS control unit to output the data strobe signal DQS that is longer than a burst length, which is defined in a standard, by "2*M" (M: an integer of one or greater) clock cycle, and on the DQ control unit to add M pieces of data to a beginning and an end of the expected value sequence, in which the number of data included in the expected value data sequence matches the burst length, and to output the expected value data sequence with the added data.

Note that implementations of the method according to the above-mentioned aspect in the form of an apparatus and a method, and a program for causing a computer to execute the method, and the like may also be effective as aspects of the present invention.

Advantageous Effects of Invention

According to the technique of the present invention, it is possible to improve adjustment accuracy of a delay time of a data strobe signal DQS at the time of write leveling and also prevent an initialization time from becoming long.

DESCRIPTION OF EMBODIMENTS

Figure 1:
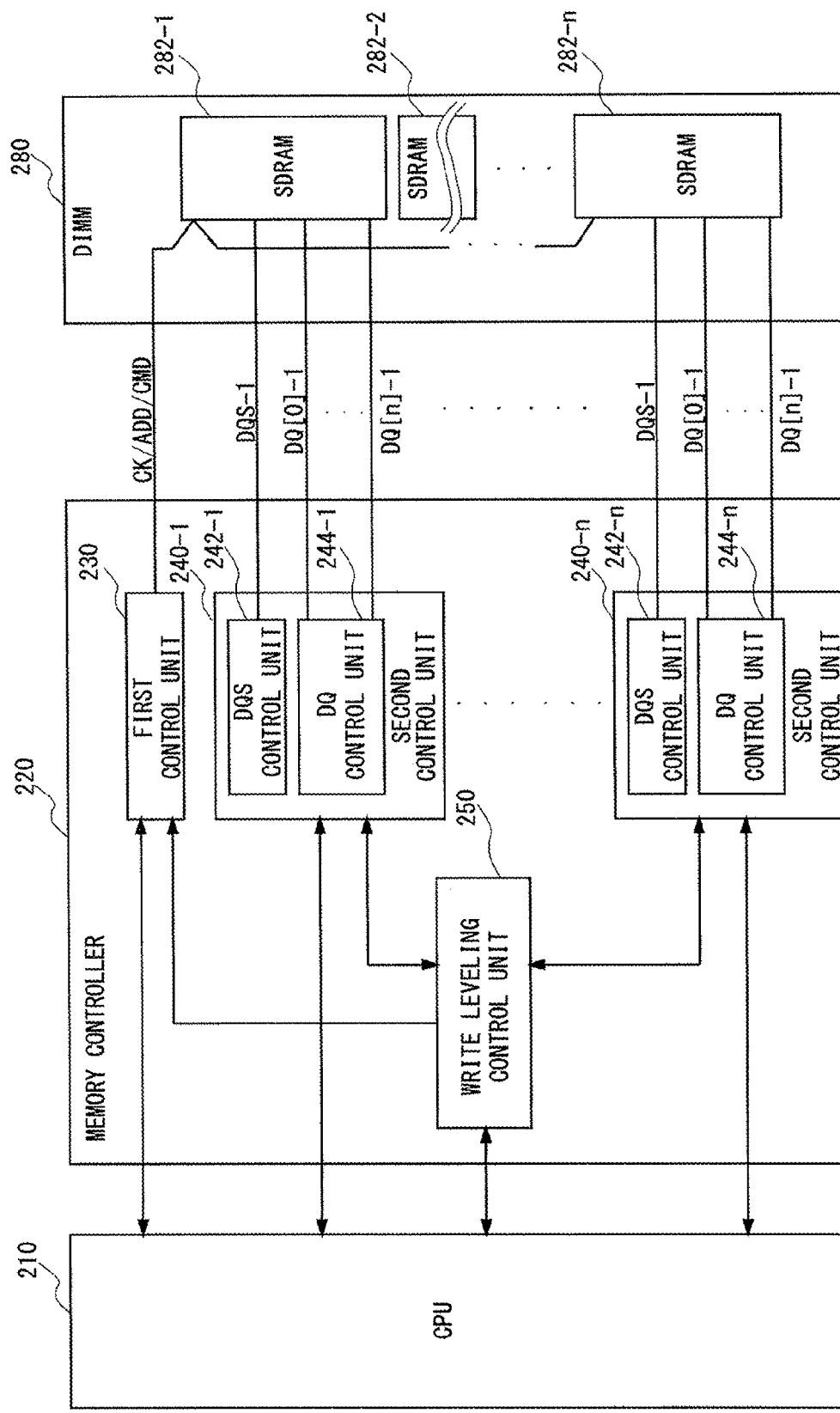
FIG. 1 is a diagram showing a computer according to an exemplary embodiment of the present invention.

Hereinafter, an exemplary embodiment of the present invention shall be explained as follows with reference to the drawings. For clarity of the explanation, the following explanations and drawings are omitted or simplified as appropriate. Further, the elements illustrated in the drawings as functional blocks for performing various processes can be implemented hardware-wise by a CPU, a memory, and other circuits, and software-wise by a program loaded onto a memory or the like. Accordingly, it is to be understood by those skilled in the art that these functional blocks can be implemented in various forms including, but not limited to, hardware alone, software alone, and a combination of hardware and software. Note that in the drawings, the same elements are denoted by the same reference numerals, and a repeated description is omitted as needed.

FIG. 1 shows a semiconductor apparatus, for example, a computer 200 according to an exemplary embodiment of the present invention. The computer 200 includes a CPU 210, a memory controller 220, and a DIMM 280.

The DIMM 280 includes n (n: an integer of two or greater) SDRAMs 282 (SDRAMs 282-1 to 282-n).

Hereinafter, as for codes to represent a plurality of functional blocks having the same function, when any one of the plurality of functional blocks is specified, only "K" (K: number) shall be used, while when it is necessary to identify a specific one of the plurality of functional blocks, the numeral K is followed by "-N" (N: number).

As for codes to represent the SDRAMs included in the DIMM 280, when it is necessary to identify a specific one of the plurality of SDRAMs 282-1 to 282-n, the codes "282-1" to "282-n" shall be used, while when any given SDRAM is specified, only a code "282" shall be used.

Similarly for signals, as for codes to represent a plurality of signals of the same type, when any given signal is specified, only W (W: a letter) shall be used, while when it is necessary to identify a specific one of the plurality of signals, the letter W shall be followed by "-N" (N: number).

For example, as for codes to represent data strobe signals, which will be explained later, when it is necessary to identify a specific one from among DQS-1 to DQS-n, codes "DQS-1" to "DQS-n" shall be used, while when any given data strobe signal is specified, only a code "DQS" shall be used.

The memory controller 220 includes a first control unit 230, second control units 240 (second control units 240-1 to 240-n) for the number of the SDRAMs 282, and a write leveling control unit 250. Each of the second control units 240 includes a DQS control unit 242 and a DQ control unit 244.

The computer 200 of this exemplary embodiment employs a memory interface of the DDR3 format. Therefore, among signal lines connecting between the memory controller 220 and the DIMM 28, the signal line for a clock signal CK, an address signal Add, and a command signal CMD is connected between the memory controller 220 and n SDRAMs in the DIMM 280 by daisy chain wiring. Further, the signal lines for a data signal DQ and a data strobe signal DQS are connected between the memory controller 220 and the respective n SDRAMs 282 in the DIMM 280.

The memory controller 220 is connected to the CPU 210 and, at the time of initialization, performs write leveling on the DIMM 280 according to a write leveling operation instruction from the CPU 210.

The first control unit 230 in the memory controller 220 outputs a clock signal CK, an address signal Add, and a command signal CMD to the DIMM 280. Those signals are provided for the respective SDRAMs 282 in order of the SDRAM 282-1, SDRAM 282-2, . . . , and SDRAM 282-n, through the above-mentioned signal lines that are wired by a daisy chain.

According to a write instruction from the write leveling control unit 250, the DQS control unit 242 in the second control unit 240 outputs the data strobe signal DQS to the corresponding SDRAM 282, and the DQ control unit 244 transmits data (DQ[0001], . . . DQ[n]) to the SDRAM 282.

Figure 2:
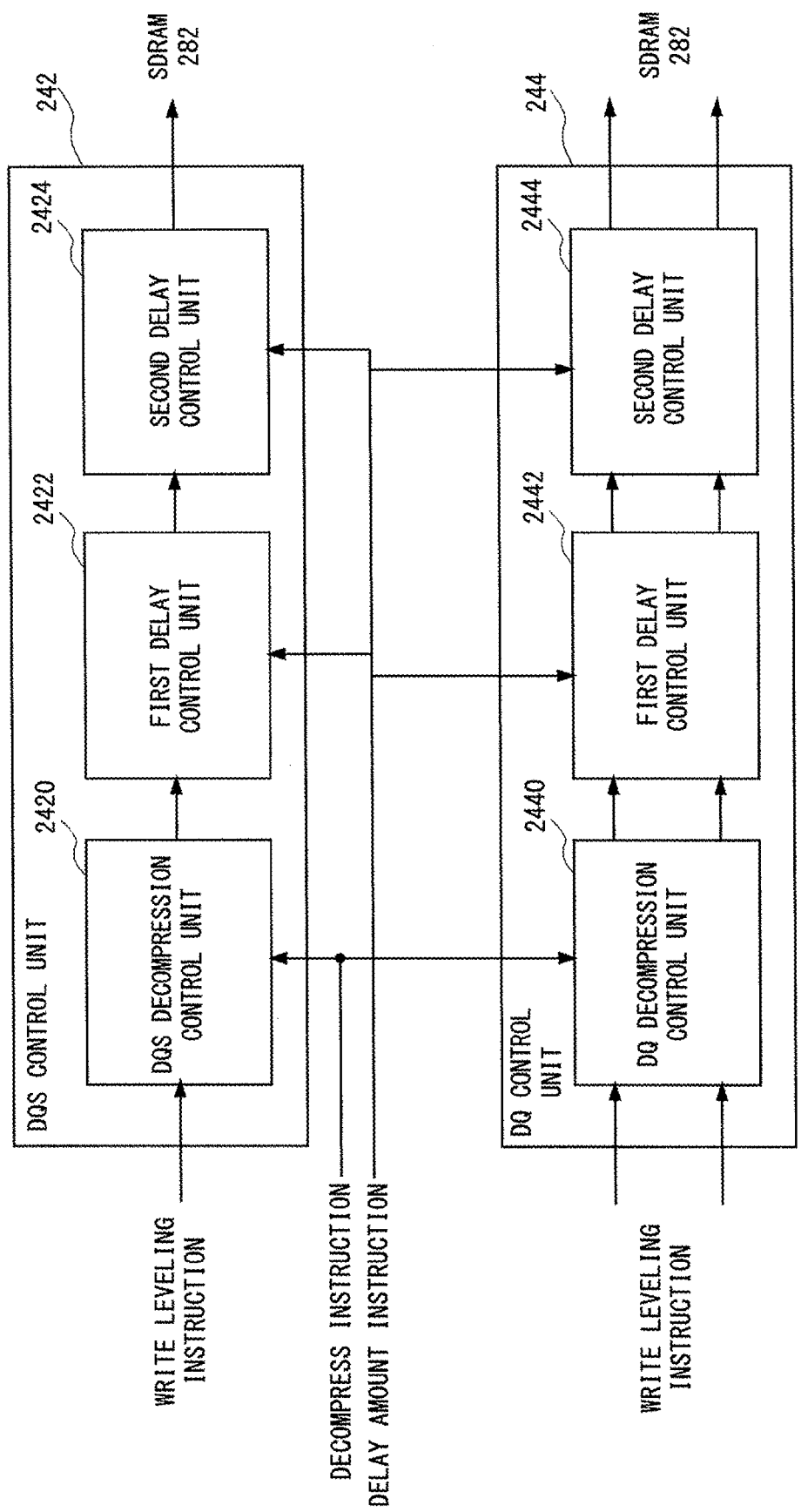
FIG. 2 is a diagram showing a second control unit 240 in the computer shown in FIG. 1.

The second control unit 240 shall be explained in detail with reference to FIG. 2. As shown in the drawing, the DQS control unit 242 in the second control unit 240 includes a DQS decompression control unit 2420, a first delay control unit 2422, and a second delay control unit 2424. Further, the DQ control unit 244 in the second control unit 240 includes a DQ decompression control unit 2440, a first delay control unit 2442, and a second delay control unit 2444. The first delay control unit 2422 and the second delay control unit 2424 constitute a DQS delay unit, while the first delay control unit 2442 and the second delay control unit 2444 constitute a DQ delay unit.

Firstly, each functional block in the DQS control unit 242 shall be explained. The DQS decompression control unit 2420 performs control to increase the number of DQSs which will be issued according to an instruction from the write leveling control unit 250.

The first delay control unit 2422 is composed of a combination of a register and a selector and is capable of delaying DQS by the unit of a clock cycle.

The second delay control unit 2424 is composed of a DLL and is capable of adjusting the delay time of DQS at a necessary granularity (e.g., 1/16 clock cycle) within a range of less than one clock cycle.

A sum of the delay times by the first delay control unit 2422 and the second delay control unit 2424 will be a delay time of the DQS.

Next, each functional block in the DQ control unit 244 shall be explained. The DQ decompression control unit 2440 performs control to increase the number of DQ which will be issued according to an instruction from the write leveling control unit 250.

The first delay control unit 2442 is composed of a combination of a register and a selector and is capable of delaying DQ by the unit of a clock cycle.

The second delay control unit 2444 is composed of a DLL and is capable of adjusting the delay time of DQ at a necessary granularity (e.g., 1/16 clock cycle) within a range of less than one clock cycle.

A sum of the delay times by the first delay control unit 2442 and the second delay control unit 2444 will be a delay time of the DQ.

Figure 3:
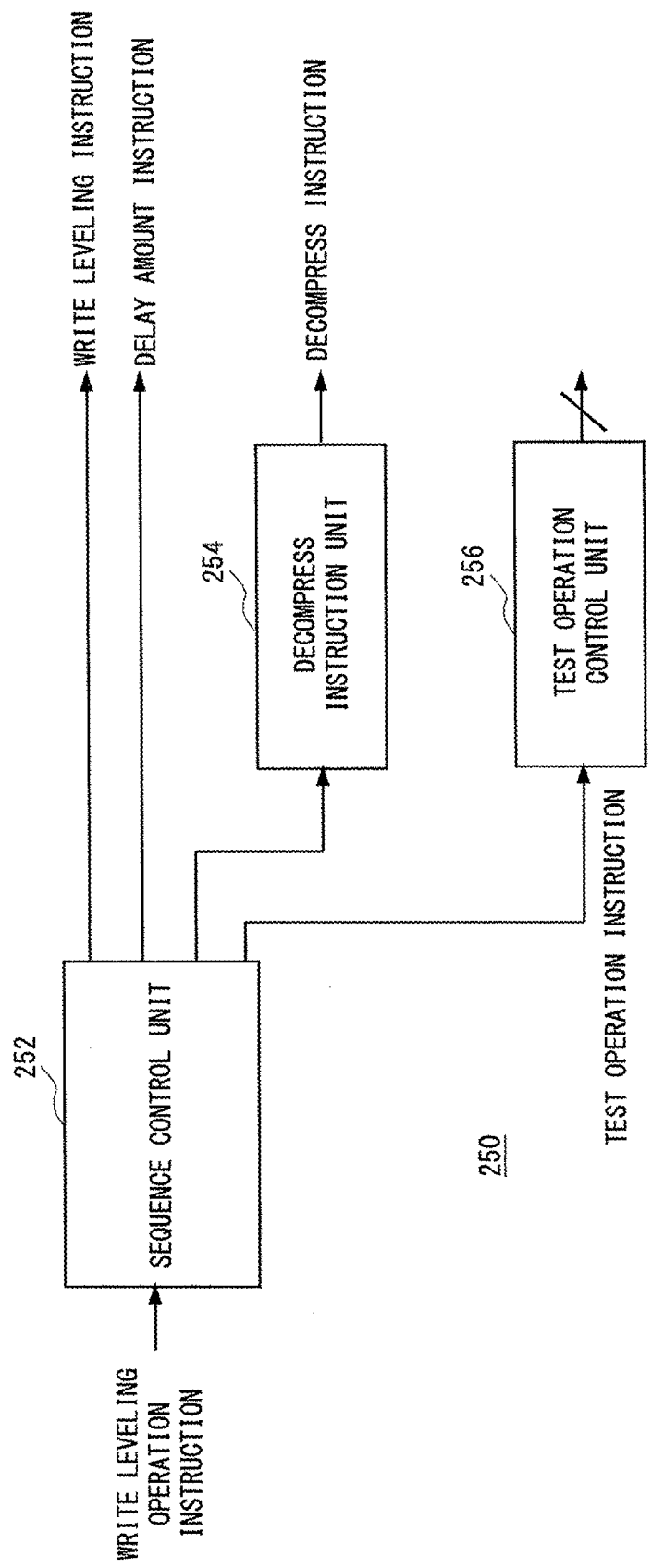
FIG. 3 is a diagram showing a write leveling control unit in the computer shown in FIG. 1.

The write leveling control unit 250 shall be explained with reference to FIG. 3. The write leveling control unit 250 includes a sequence control unit 252, a decompression instruction unit 254, and a test operation control unit 256.

The sequence control unit 252 starts the write leveling according to the write leveling operation instruction from the CPU 210 and controls adjustment of the delay times of the DQS, and DQ[0002], . . . DQ[n] in the write leveling. This adjustment of the DQS is performed in two phases by the first delay control unit 2422 and the second delay control unit 2424. Similarly, this adjustment for the DQ is performed in two phases by the first delay control unit 2442 and the second delay control unit 2444.

Note that the above control is implemented in the following manner: the sequence control unit 252 outputs a write leveling instruction to the first control unit 230, outputs a delay amount instruction to the first delay control unit 2422 and the second delay control unit 2424 in the DQS control unit 242 in the second control unit 240 and to the first delay control unit 2442 and the second delay control unit 2444 in the DQ control unit 244 in the second control unit 240; Further, the sequence control unit 252 controls the decompression instruction unit 254 to output a decompression instruction to the DQS decompression control unit 2420 in the DQS control unit 242 and the DQ decompression control unit 2440 in the DQ control unit 244, and outputs a test operation instruction to the test operation control unit 256.

According to the control by the sequence control unit 252, the decompression instruction unit 254 outputs an instruction (decompression instruction) for decompressing the data strobe signal DQS and the data signal DQ to the DQS decompression control unit 2420 in the DQS control unit 242 in the second control unit 240 and the DQS decompression control unit 2420 in the DQ control unit 244 in the second control unit 240.

Figure 4:
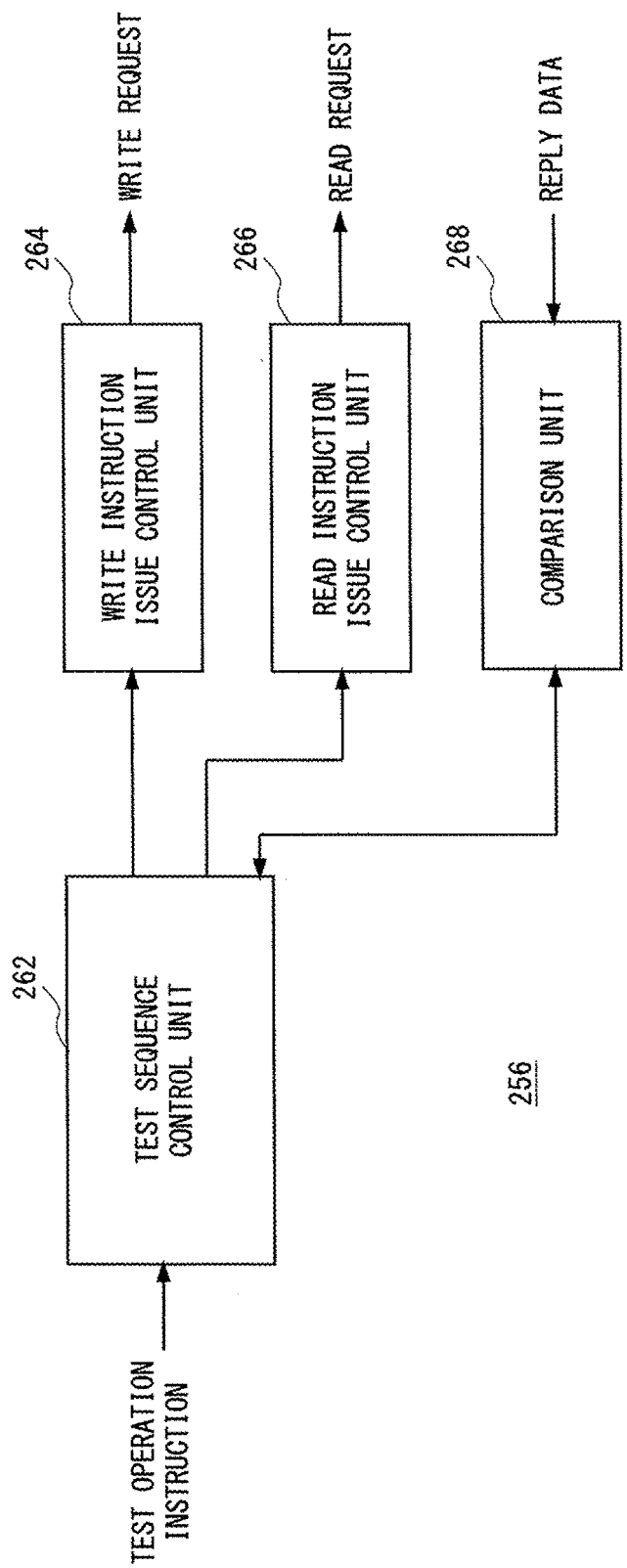
FIG. 4 is a diagram showing a test operation control unit in the write leveling control unit shown in FIG. 3.

In response to the test operation instruction from the sequence control unit 252, the test operation control unit 256 performs processing to output a write request to the first control unit 230 and the second control unit 240, processing to output a read request to the first control unit 230, and processing to compare reply data (which will be explained later) with an expected value. The test operation control unit 256 shall be explained in detail with reference to FIG. 4.

The test operation control unit 256 includes a test sequence control unit 262, a write instruction issue control unit 264, a read instruction issue control unit 266, and a comparison unit 268.

In response to the test operation instruction from the write leveling control unit 250, the test sequence control unit 262 controls the write instruction issue control unit 264, the read instruction issue control unit 266, and the comparison unit 268 to read/write data from/to the DIMM 280 and to compare the reply data with the expected value.

According to an instruction from the test sequence control unit 262, the write instruction issue control unit 264 issues a write request to the DIMM 280.

According to an instruction from the test sequence control unit 262, the read instruction issue control unit 266 issues a read request to the DIMM 280.

The comparison unit 268 receives the data (reply data) output from the DIMM 280 in response to the above-mentioned read request and compares the reply data with the expected value and also notifies the test sequence control unit 262 of a result of the comparison.

Next, a flow of the write leveling by the computer 200 shown in FIG. 1 shall be explained. The write leveling operation instruction issued by the CPU 210 is received by the sequence control unit 252 inside the write leveling control unit 250 in the memory controller 220.

When the write sequence control unit 252 receives the write leveling operation instruction, the write sequence control unit 252 starts a write leveling operation. Adjustment of a delay time in the write leveling operation is performed in two phases. An explanation of the adjustment shall be given with reference to flowcharts of FIGS. 5 and 6.

Figure 5:
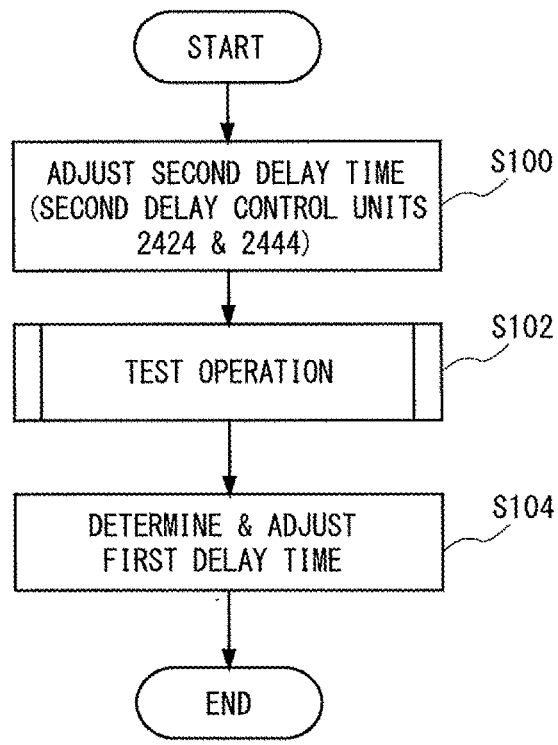
FIG. 5 is a flowchart showing a flow of write leveling by the write leveling control unit shown in FIG. 3.

As shown in FIG. 5, firstly in Step S100, the second delay control unit 2424 in the DQS control unit 242 and the second delay control unit 2444 in the DQ control unit 244 adjust the delay time within a range of less than one clock cycle. Hereinafter, a delay time of the second delay control unit 2424 and the second delay control unit 2444 shall be referred to as a "second delay time. By such stepped adjustment, in each of the SDRAMs 282, the clocks distributed to the respective SDRAMs 282 and DQS/DQ[0003], . . . DQ[n] are considered to have been adjusted.

Note that such stepped adjustment is adjustment of the DQS based on the clock signal CLK and is the write leveling operation defined in the specifications of the DIMM.

However, as an adjustment time in the step is less than one clock cycle even at its maximum, the adjusted clock edges may be misaligned among the SDRAMs 282.

Next, a test operation for detecting the misalignment in the clock edges of the SDRAMs 282 is started (S102). Specifically, after the processing of Step S100 is completed, the write leveling control unit 250 issues the test operation instruction to the test operation control unit 256. In response to the test operation instruction from the sequence control unit 252, the test operation control unit 256 performs a test operation.

Figure 6:
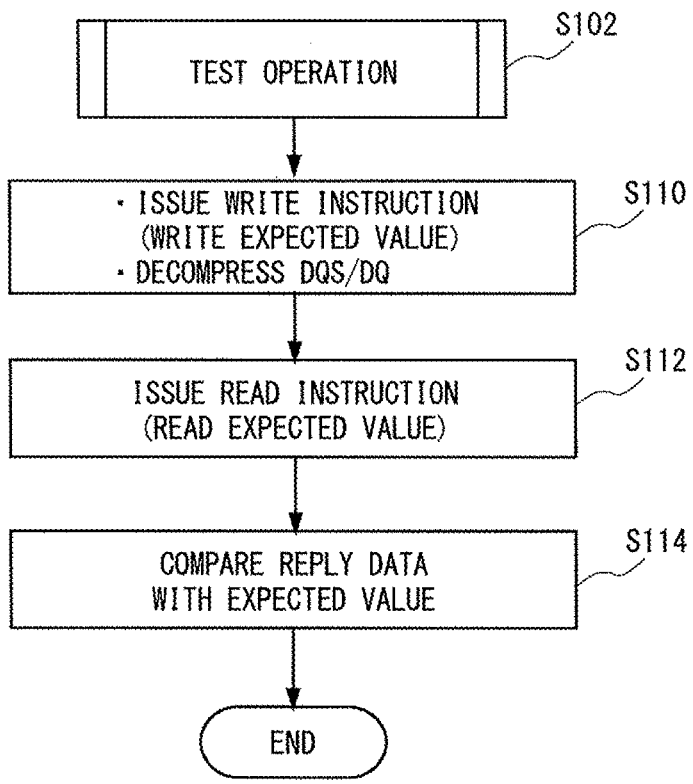
FIG. 6 is a flowchart showing a flow of a test operation in the write leveling shown in FIG. 5.

FIG. 6 is a flowchart of the test operation. Firstly, the test operation control unit 256 issues a write request to the DIMM 280 and writes an expected value data sequence that is composed of a plurality of pieces of known data (S110).

The write request is issued by transmitting a write instruction issue instruction from the test sequence control unit 262 to the write instruction issue control unit 264. However, if the write request is issued at this point, due to the misalignment in the clock edges of the SDRAMs 282, a first one or more pieces of data or a last one or more pieces of data in an expected value data sequence may not be written depending on the SDRAM 282. Thus, it may be possible that the SDRAM 282 needs a reset.

In order to avoid such a situation, the write leveling control unit 250 further transmits a decompression instruction to the second control units 240-1, . . . 240-n in the step.

In response to the decompression instruction, the DQS decompression control units 2420 inside the DQS control units 242 in the second control units 240-1 . . . , and 240-n issue a data strobe signal DQS that has a clock cycle longer than a specified burst length by "2*M" (M: an integer of one or greater) to the DIMM 280.

Further, in response to the decompression instruction, the DQ decompression control unit 2440 inside the DQ control unit 244 adds M pieces of data to the beginning and end of the above-mentioned expected value sequences, in which the number of pieces of data included in the expected value matches the specified burst length, and issues the decompressed data to the DIMM 280.

Next, the test sequence control unit 262 issues a read request for reading the data written in Step S110 to the DIMM 280 (S112).

The read request is issued by transmitting a read instruction issue instruction from the test sequence control unit 262 to the read instruction issue control unit 266.

In response to the read request, the reply data (read data sequence) is output from the DIMM 280. The comparison unit 268 receives the reply data and compares the reply data with the expected value data sequence and also transmits a result of the comparison to the test sequence control unit 262 (S114). Further, the result of the comparison is output from the test sequence control unit 262 to the sequence control unit 252.

Returning back to FIG. 5, an explanation shall be continued. Based on the result of the comparison obtained from the comparison unit 268, the sequence control unit 252 sets a delay amount of the first delay control unit 2422 in the DQS control unit 242 and the first delay control unit 2442 in the DQ control unit 244, and transmits a delay amount instruction indicating the delay amount to the second control units 240-1, 240-2, . . . , and 240-n. Note that a delay value set by the sequence control unit 252 in this step shall be hereinafter referred to as a "first delay time". Further, the first delay time is an integral multiple (including zero time) of the clock cycle.

Each of the first delay control units 2422 and the first delay control units 2442 adjusts the delay time by the first delay time that is set by the test sequence control unit 262. The write leveling is completed in this manner.

The write leveling in the computer 200 shall be explained in more detail with reference to a specific example.

As explained so far, in the computer 200 of this exemplary embodiment, the adjustment of the delay time in the write leveling is performed in two phases. Firstly, in the adjustment in the first phase indicated by Step S100 in the flowchart of FIG. 5, each of the second delay control units 2424 and the second delay control units 2444 adjusts the delay time (the second delay time) within one clock cycle.

Figure 7:
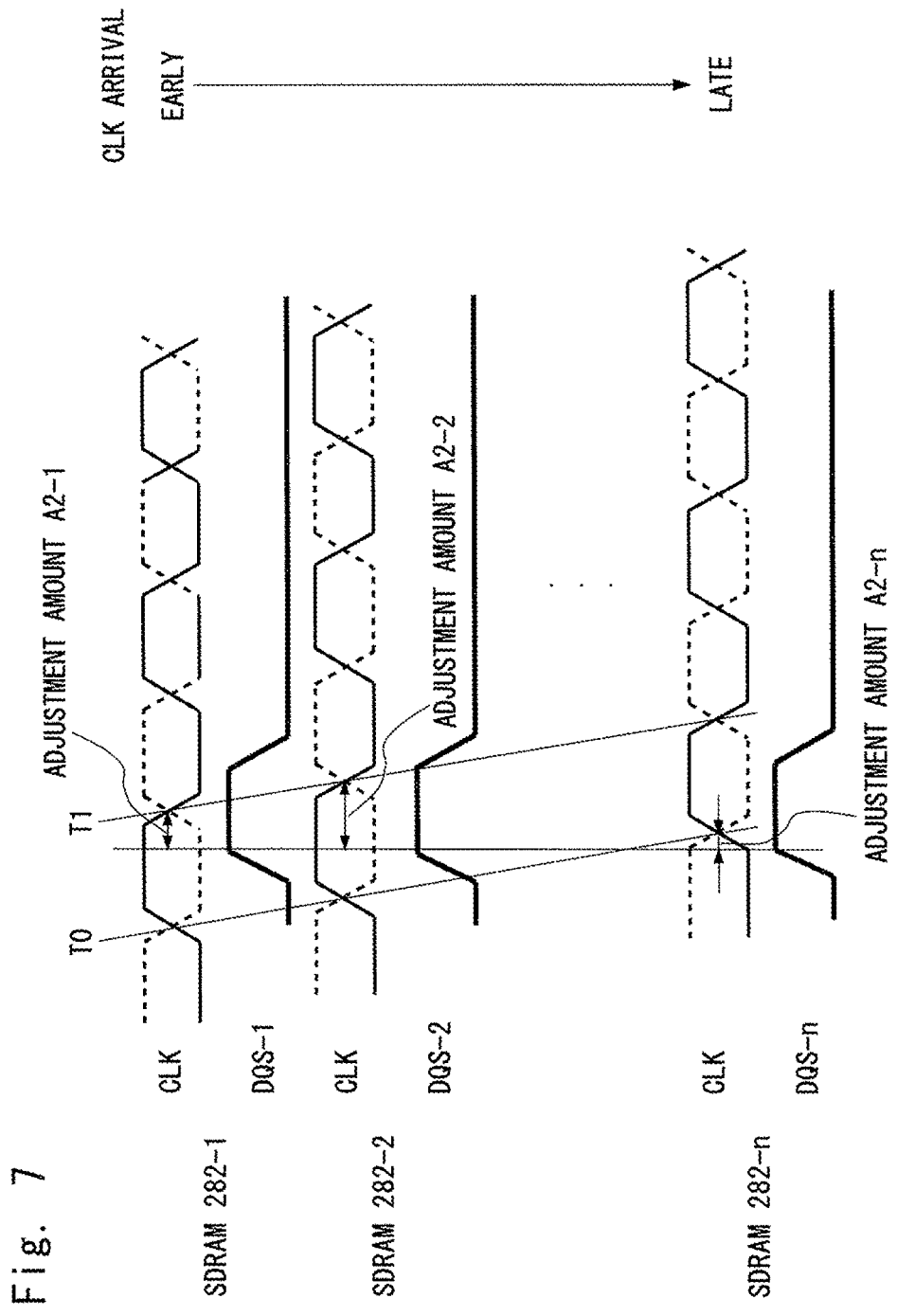
FIG. 7 is a diagram for explaining adjustment of a second delay time.

For example, as in the example shown in FIG. 7, as for the SDRAM 282-1, the adjustment of the second delay time is made by an adjustment amount A2-1 in order to align a clock edge with a T1 edge of a clock signal. Further, as for the SDRAM 282-2, the adjustment of the second delay time is made by an adjustment amount A2-2 in order to align a clock edge with a T1 edge of a clock signal. Furthermore, as for the SDRAM 282-*n*, the adjustment of the second delay time is made by an adjustment amount A2-*n* in order to align a clock edge with a T0 edge of a clock signal. Note that as for ADD/CMD, assume that it is aligned with a T1 edge of a clock signal.

Next, a test operation shown in FIG. 6 is performed. As stated above, in the test operation, firstly the expected value is written in the DIMM 280 by the write request. When CLK edges are misaligned among the SDRAMs 282 even after the above-mentioned adjustment of the second delay time and the write request in accordance with the normal specifications is issued, as for the SDRAM 282-*n*, the expected value arrives at a T0 edge, which is one cycle (1T) earlier than the T1 edge with which ADD/CMD is synchronized, thereby leading to a state shown in FIG. 8 in which the specifications are violated. A specific explanation shall be given with reference to FIG. 8. Note that in FIG. 8 and subsequent drawings, "ACT" and "WRA" have the same definitions as those defined in the JEDEC specifications of DDR3, and they are mnemonic expressions of "Activate" instruction and "Write+AutoPrecharge" instructions, respectively. Further, "WL" (Write Latency) has the same definition as the one defined in the JEDEC specifications of DDR3 and indicates a data output timing of a write instruction.

Figure 8:
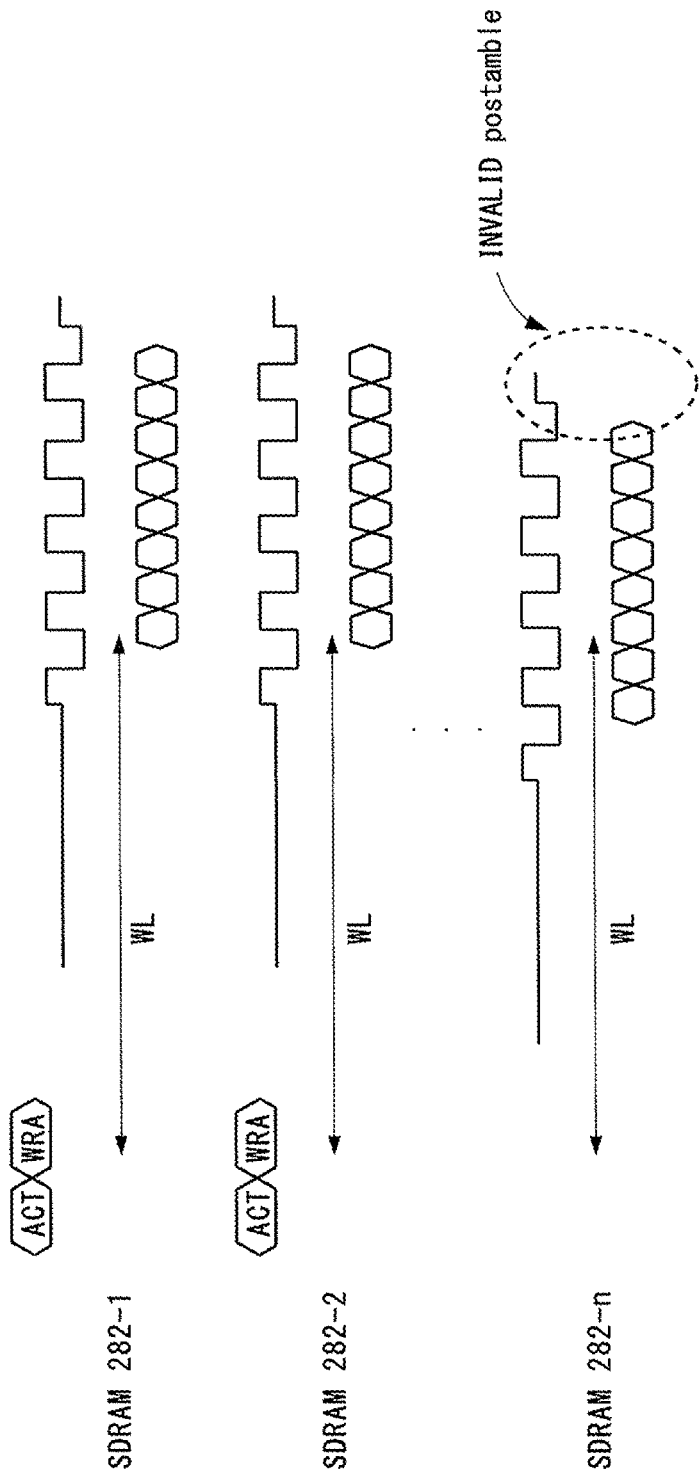
FIG. 8 is a diagram showing an example for explaining the meaning of decompression of a data strobe signal and a data signal at the time of the write leveling (1)

As shown in FIG. 8, as for the SDRAM 282-1 and the SDRAM 282-2, since the relationship between ADD/CMD and write data matches, even when an expected value data sequence including the number of pieces of data that matches the normal burst length is issued, it will not be necessary to reset the SDRAM 282.

However, as for the SDRAM 282-*n*, since DQS/DQ[0004] ... DQ[n] are synchronized with a T0 edge of the CLK, DQS/DQ[0005], ... DQ[n] arrive at the SDRAM 282-*n* 1T earlier than ADD/CMD does. Therefore, the end of the data is lost, thereby leading to invalid postamble and there is no other method to return other than performing a reset.

The decompression of DQS and DQ is processing to avoid such a state. As explained above, according to the decompression instruction from the write leveling control unit 250, the DQS decompression control units 2420 in the DQS control units 242 in the second control units 240-1, ..., and 240-*n* decompress the DQS by expanding the DQS by "2*M" cycle and issues the decompressed DQS to the DIMM 280. Similarly, the DQ decompression control unit 2440 inside the DQ control unit 244 decompresses the DQ by expanding the DQ by M cycle at the beginning and the end of the DQ and issues the decompressed DQ to the DIMM 280.

For example, DQS/DQ[0006], ..., and DQ[n] are decompressed by being expanded by two cycles and issued (M=2). Specifically, the DQS is transmitted with extra 2Ts at the beginning and end of the DQS, and data of 16 bursts (eight consecutive blocks) is transmitted to the DIMM 280.

Figure 9:
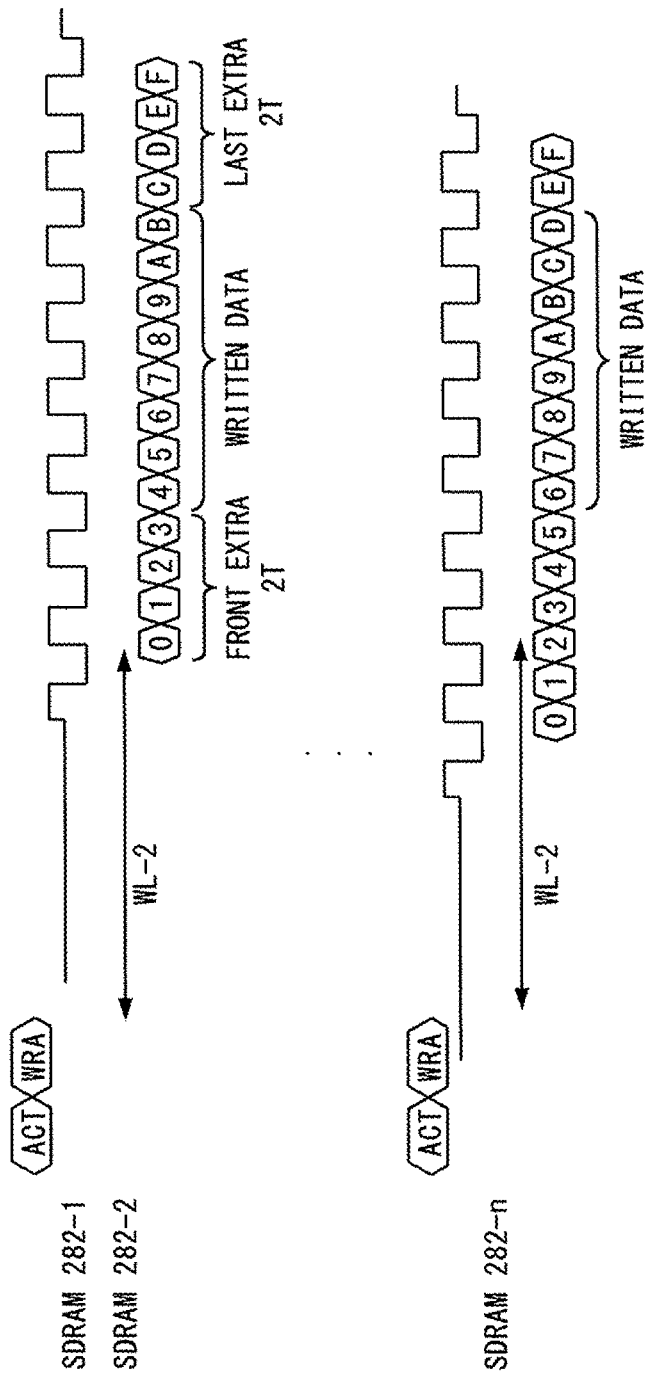
FIG. 9 is a diagram showing an example for explaining the meaning of decompression of the data strobe signal and the data signal at the time of the write leveling (2)

In such a case, as shown in FIG. 9, DQS/DQ[0007], ..., and DQ[n] are decompressed by being expanded by 2T at the beginning and end as compared to an original output position (burst eight). Therefore, the SDRAM 282-*n* will not be in a state of violating the specifications. The SDRAM will thus not be unstable, thereby eliminating the need for a reset operation of the SDRAM. Note that in such a case, pieces of data, which are 4, 5, 6, 7, 8, 9, A, and B, are written in the SDRAMs 282-1 and 282-2, while pieces of data, which are 6, 7, 8, 9, A, B, C, and D, are written in the SDRAM 282-*n*.

Figure 10:
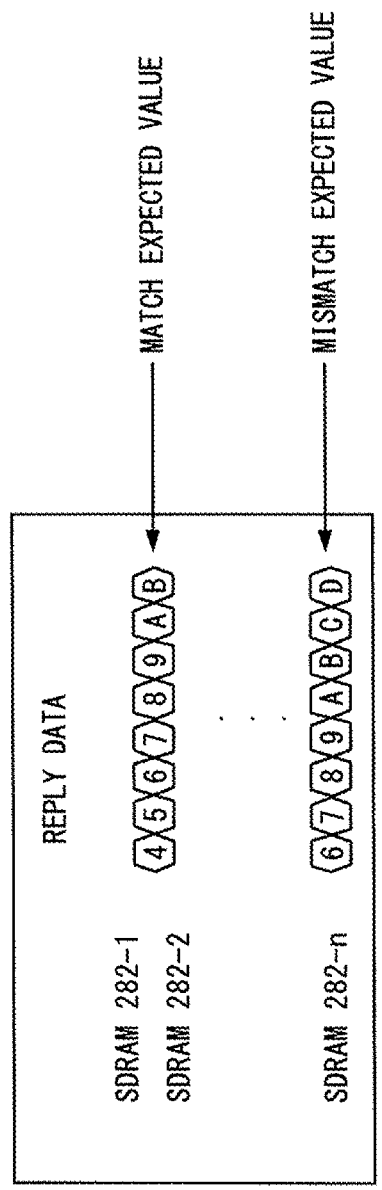
FIG. 10 is a diagram showing a read data sequence obtained in a case of the example shown in FIG. 9.
Figure 11:
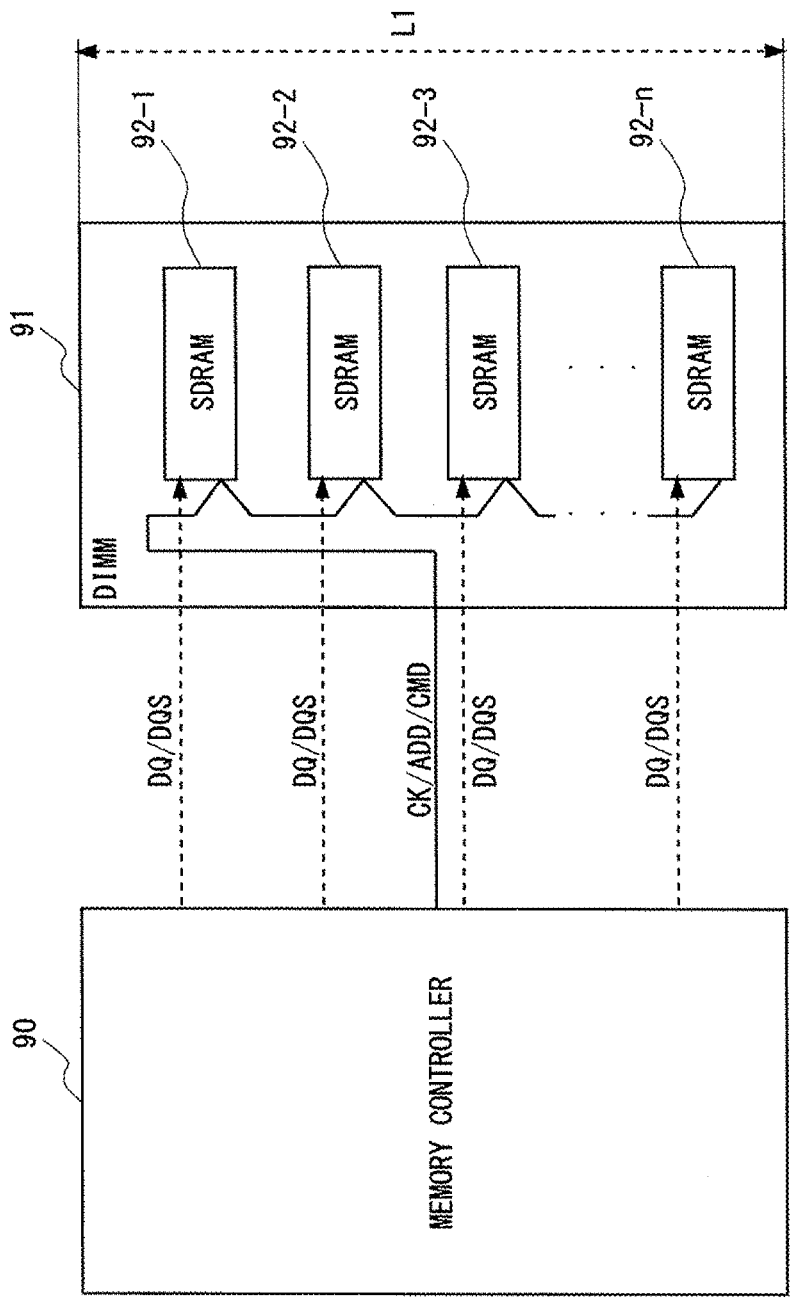
FIG. 11 is a diagram schematically showing an example of a connection that is compliant with the DDR3 memory interface.
Figure 12:
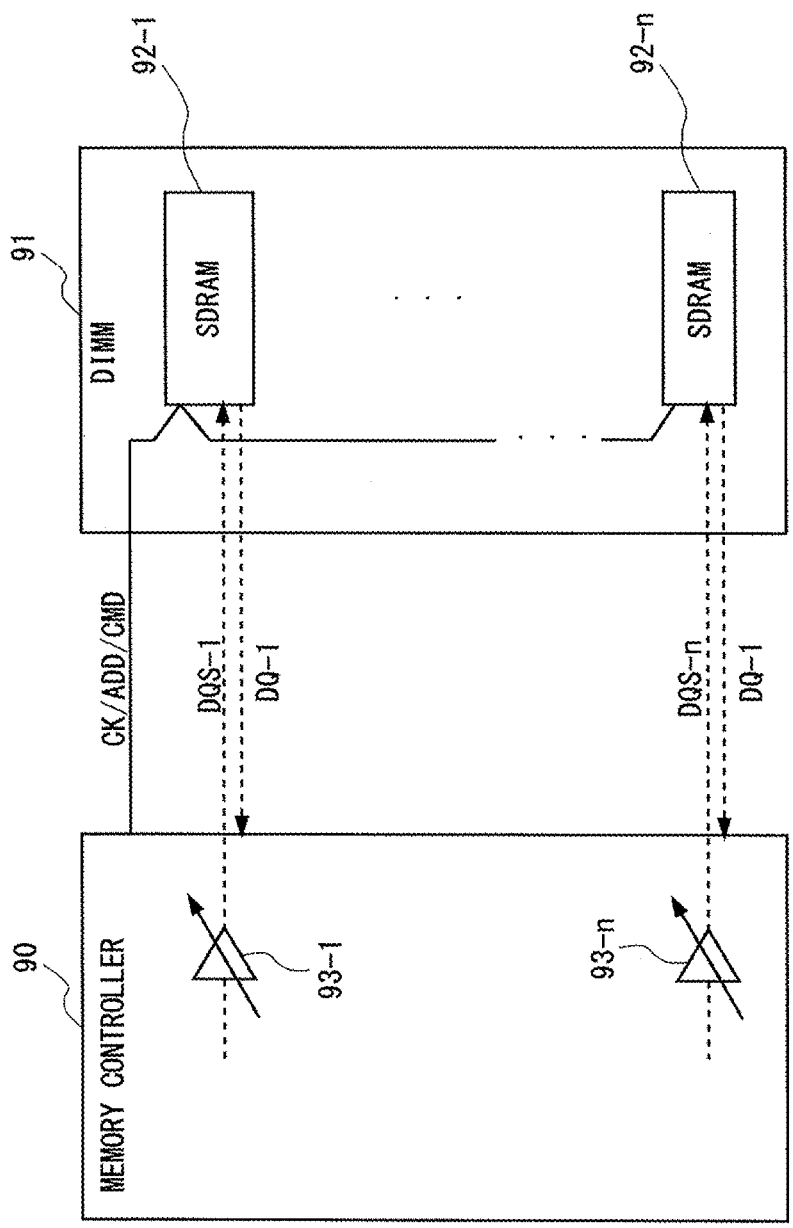
FIG. 12 is a diagram for explaining the write leveling.

After that, in response to the read request, the reply data is transmitted from the respective SDRAMs 282 to the comparison unit 268, and the reply data is compared with the expected values (4, 5, 6, 7, 8, 9, A and B). In the example shown in FIG. 9, since the reply data is returned as shown in FIG. 10, as for the SDRAMs 282-1 and 282-2, the reply data matches the expected value, and as for the SDRAM 282-*n*, the reply data is misaligned forward by two pieces of data with respect to the expected value. Then, the comparison unit 268 returns a result of the comparison indicating, for example "0" (match), to the SDRAMs 282-1 and 282-2 and returns a result of the comparison indicating, for example "−1" (earlier by 1T), to the SDRAM 282-*n*. Further, the test sequence control unit 262 outputs each of the results of the comparison to the sequence control unit 252.

The sequence control unit 252 determines the adjustment amounts of each of the first delay times and outputs the delay amount instructions indicating the respective delay amounts to the first delay control units 2422 and the first delay control units 2442. In the case of the result of the comparison shown in FIG. 10, a delay amount instruction of "−1" indicating "no delay time" is output to the first delay control units 2422 and the first delay control units 2442 corresponding to the SDRAMs 282-1 and 282-2. Further, a delay amount instruction of "−1" indicating "adjust a delay time by −1 clock cycle" is output to the first delay control unit 2422 and the first delay control unit 2442 corresponding to the SDRAM 282-*n*.

Each of the first delay control units 2422 and the first delay control units 2442 sets a delay time that is indicated by the received delay amount instruction. Thus, also for the SDRAM 282-*n*, the misalignment between ADD/CMD and DQS/DQ is eliminated.

As described so far, in the computer 200 of this exemplary embodiment, in the write leveling performed at the time of initialization, when the expected value data sequence is written, the data strobe signal DQS is decompressed by being expanded by "2*M" cycle with respect to the burst length defined by the standard, and further, M pieces of data are added to the beginning and end of the above-mentioned expected value data sequence and the expected value data sequence with the added data is output. Therefore, even in the case of the SDRAM 282 in which the edges of the data strobe signal DQS and the clock signals CK are misaligned, it is possible to avoid a situation where resetting the SDRAM 282 is inevitable due to a lack of data to be written and thereby to avoid an initialization time from becoming long.

Further, in the computer 200, firstly the second delay control unit 2424 and the second delay control unit 2444, which are DLL circuits, are used to finely adjust the data strobe signal DQS and the data signal DQ in the range of less than one cycle. After that, the first delay control unit 2422 and the first delay control unit 2442, which are composed of a combination of a register and a selector, are used to roughly adjust the data strobe signal DQS and the data signal DQ by the unit of cycle. In this manner, it is possible to accurately adjust the delay time of the data strobe signal DQS even in a memory device where the clock signal CK and the data strobe signal DQS are largely misaligned from each other.

Although the present invention has been explained with reference to the exemplary embodiment, the present invention is not limited by the above. Various modifications, obvious to those skilled in the art, can be made to the configurations and details of the present invention within the scope of the invention.

For example, in the above-mentioned computer 200 of the exemplary embodiment, in order to improve adjustment accuracy, two delay circuits with different adjustment granularity are used to implement delay of each of the data strobe signals DQS and the data signals DQ. However, one delay circuit may be used to implement two-phase delay. In such a case, although the adjustment accuracy is less than that of the computer 200, it is possible to achieve the effect of avoiding the initialization time from becoming long, in a manner similar to that by the computer 200.

INDUSTRIAL APPLICABILITY

The present application claims priority rights of and is based on Japanese Patent Application No. 2011-194242 filed on Sep. 6, 2011 in the Japanese Patent Office, the entire contents of which are hereby incorporated by reference.

REFERENCE SIGNS LIST

90 MEMORY CONTROLLER
91 DIMM
92 SDRAM
93 DELAY CIRCUIT
200 COMPUTER
210 CPU
220 MEMORY CONTROLLER
230 FIRST CONTROL UNIT
240 SECOND CONTROL UNIT
242 DQS CONTROL UNIT
2420 DQS DECOMPRESSION CONTROL UNIT
2422 FIRST DELAY CONTROL UNIT
2424 SECOND DELAY CONTROL UNIT
244 DQ CONTROL UNIT
2440 DQ DECOMPRESSION CONTROL UNIT
2442 FIRST DELAY CONTROL UNIT
2444 SECOND DELAY CONTROL UNIT
250 WRITE LEVELING CONTROL UNIT
252 SEQUENCE CONTROL UNIT
254 DECOMPRESSION INSTRUCTION UNIT
256 TEST OPERATION CONTROL UNIT
262 TEST SEQUENCE CONTROL UNIT
264 WRITE INSTRUCTION ISSUE CONTROL UNIT
266 READ INSTRUCTION ISSUE CONTROL UNIT
268 COMPARISON UNIT
280 DIMM
282 SDRAM
Add ADDRESS SIGNAL
CK CLOCK SIGNAL
CMD COMMAND SIGNAL
DQ DATA SIGNAL
DQS DATA STROBE SIGNAL

The invention claimed is:
1. A memory controller that is connected to a memory module which is compliant with a DDR3 memory interface, the memory controller comprising:
DQS control unit that outputs a data strobe signal DQS to a memory element, the DQS control unit being provided for each of the memory elements included in the memory module;
DQ control unit that signals DQS, outputs write data, and receives read data in synchronization with the date strobe signal DQS, the DQ control unit being provided for each of the memory element included in the memory module, and the data strobe signal DQS being output to the memory element; and
write leveling control unit that controls write levelling, the write leveling being performed at the time of initialization, wherein:
the DQS control unit comprises a DQS delay unit that delays an output timing of the data strobe signal DQS by a delay amount that is set by the write leveling control unit,
the DQ control unit comprises a DQ delay unit that delays an output timing of the write data and a reception timing of the read data by the delay amount that is set by the write leveling control unit,
at the time of the write leveling, after adjustment of a delay amount of less than one clock cycle is performed on the DQS delay unit and the DQ delay unit, the write leveling control unit compares a read data sequence, which is obtained by reading the read data sequence after writing an expected value data sequence, with the expected value data sequence for each of the memory elements and adjusts the delay amount by a unit of a clock cycle in accordance with a result of a comparison for each of the DQS delay unit and the DQ delay unit, and
at the time of the writing, the write leveling control unit controls the DQS control unit to output the data strobe signal DQS that is longer than a burst length, which is defined in a standard, by "2*M" (M: an integer of one or greater) clock cycle, and controls the DQ control unit to add M pieces of data to a beginning and an end of the expected value data sequence, in which the number of data included in the expected value data sequence matches the burst length, and to output the expected value data sequence with the added data.
2. The memory controller according to claim 1, wherein the DQS delay unit comprises:
a first DQS delay unit capable of performing delay by the delay amount of more than or equal to one clock cycle; and
a second DQS delay unit capable of performing delay by the delay amount of less than one clock cycle;
the DQ delay unit comprises:
a first DQ delay unit capable of performing delay by the delay amount of more than or equal to one clock cycle; and
a second DQ delay unit capable of performing delay by the delay amount of less than one clock cycle,
the write leveling control unit sets the delay amount of the second DQS delay unit and the second DQ delay unit to thereby adjust the delay amount of less than one clock cycle, and
the write leveling control unit sets the delay amount of the first DQS delay unit and the first DQ delay unit to thereby adjust the delay amount by the unit of the clock cycle.
3. The memory controller according to claim 2, wherein the first DQS delay unit and the first DQ delay unit are combinations of a register and a selector, and the second DQS delay unit and the second DQ delay unit are DLL circuits.
4. A memory control method comprising:
for DQS control unit that is provided for each of memory elements included in a memory module that is compliant with a DDR3 memory interface and outputs a data strobe signal DQS to the memory element and for DQ control unit that is provided for each of the memory elements and synchronizes with the data strobe signal DQS that is output to the memory device, outputs write data, and receives read data, adjusting a delay amount of an output timing of the data strobe signal DQS and a delay amount of an output timing of the write data and a reception timing of the read data within a range of less than one clock cycle;

comparing a read data sequence, which is obtained by writing an expected data sequence and reading the read data sequence, with the expected value data sequence, for each of the memory elements, and according to a result of the comparison, adjusting the delay amount of the output timing of the write data and the reception timing of the read data by a unit of clock cycle in each of the DQS delay control unit and the DQ delay unit; and controlling, at the time of the writing, the DQS control unit to output the data strobe signal DQS that is longer than a burst length, which is defined in a standard, by "2*M" (M: an integer of one or greater) clock cycle, and the DQ control unit to add M pieces of data to a beginning and an end of the expected value sequence, in which the number of data included in the expected value data sequence matches the burst length, and to output the expected value data sequence with the added data.

* * * * *